United States Patent
Qian

(10) Patent No.: US 9,257,201 B2
(45) Date of Patent: Feb. 9, 2016

(54) MEMORY TESTING METHOD AND APPARATUS

(71) Applicant: Shanghai Huahong Grace Semiconductor Manufacturing Corporation, Shanghai (CN)

(72) Inventor: Liang Qian, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/585,989

(22) Filed: Dec. 30, 2014

(65) Prior Publication Data

US 2015/0255174 A1   Sep. 10, 2015

(30) Foreign Application Priority Data

Mar. 5, 2014   (CN) .......................... 2014 1 0078928

(51) Int. Cl.
*G11C 29/00* (2006.01)
*G11C 29/12* (2006.01)

(52) U.S. Cl.
CPC ..................................... *G11C 29/12* (2013.01)

(58) Field of Classification Search
USPC ................................ 365/201, 230.03, 185.33
See application file for complete search history.

(56) References Cited

U.S. PATENT DOCUMENTS

2005/0276129 A1* 12/2005 Meihong .............. G11C 7/1021 365/200

* cited by examiner

*Primary Examiner* — Vu Le
(74) *Attorney, Agent, or Firm* — Harness, Dickey & Pierce, P.L.C.

(57) ABSTRACT

A method and an apparatus for testing a memory are provided, where the memory includes a plurality of sectors each of which includes a plurality of bytes, and the testing is performed to the memory byte by byte. The method includes: during the testing, once a first byte in a first sector fails the testing, stopping testing the rest bytes in the first sector which haven't been tested, and skipping the testing to a second byte in a second sector. Accordingly, if one byte of the first sector fails the testing, the testing will be skipped to a second sector, and the remained bytes of the first sector will not be tested any more, and other testing items will not be implemented to the first sector within the whole testing flow. Therefore, redundant testing steps can be avoided and testing efficiency can be improved.

14 Claims, 3 Drawing Sheets

MEMORY TESTING METHOD AND APPARATUS

CROSS-REFERENCE TO RELATED APPLICATIONS

The present application claims priority to Chinese patent application No. 201410078928.1, filed on Mar. 5, 2014, and entitled "MEMORY TESTING METHOD AND APPARATUS", the entire disclosure of which is incorporated herein by reference.

TECHNICAL FIELD

The present disclosure generally relates to memory devices, and more particularly, to a method and an apparatus for testing memory.

BACKGROUND

In computer systems, memory devices are used for storing programs and data. Almost all information of the computer systems, such as original data, programs, intermediate results and ultimate results, can be stored in the memory devices. Under control of a controller, the memory device can operate a write process or a read processes in a specific position. Memory devices which are used for storing information, are indispensible components of the computer systems.

In order to ensure normal operation of a memory, a testing process is required after the memory is manufactured. The testing process can be implemented by a direct test, an embedded CPU (Central Processing Unit), a MBIST (Memory Built In Self Test), or the like.

In the testing process, if the memory under test has been found having a problem, such as fails to implement a write operation or a read operation, or loses data, then a repairing process is needed.

Usually, when a memory is found having a problem, the repairing process is only implemented to a portion of the memory which has the problem, rather than the entire memory. Further, a memory may include a plurality of sectors, and a sector may include a number of bytes. For example, the memory may include hundreds or thousands of sectors, and each of sectors may include 256, 512 or 1024 bytes. Accordingly, the repairing process may be implemented to one sector of the memory. Therefore, when a byte of a sector fails the testing process, then the repairing process is only implemented to the sector rather than the entire memory.

In existing testing processes, when one sector of a memory is taken as a repairing unit, the testing is implemented in an order of one sector by another. Furthermore, during testing the sector, all bytes of the sector are tested successively.

However, when one byte of a sector fails the testing, it can be obtained that the sector where the byte located should be repaired. Then, other bytes of the sector are not necessarily to be tested any more.

Memory test may include more testing items. Specifically, except standard write and read function, more special stress testing modes which screen potential reliability defect are included. So, the testing flow is longer. Furthermore, in existing testing methods including redundancy functions, even if one sector fails at the first testing item, for other testing items, the failed sector still will be tested each time. So, lots of testing time is wasted on the original failed sector. The testing efficiency is lower.

Accordingly, exiting testing processes are redundant, thus testing efficiency are lower. Therefore, a memory testing method which can avoid redundant processes and has higher efficiency is required.

SUMMARY

According to one embodiment of the present disclosure, a method for testing a memory is provided, where the memory includes a plurality of sectors each of which includes a plurality of bytes, and the testing is performed to the memory byte by byte, the method including: during the testing, once a first byte in a first sector fails the testing, stopping testing the rest bytes in the first sector which haven't been tested, and skipping the testing to a second byte in a second sector.

Optionally, when the first sector fails the testing, the method may further include recording a failure flag for the first sector, thus within a whole testing flow, the first sector will not be tested again.

Optionally, the second byte in the second sector may be the initial byte in the second sector.

Optionally, the second sector may be arranged next to the first sector.

Optionally, if all bytes in the first sector pass the testing, the testing is performed to in initial byte in a sector arranged next to the first sector.

Optionally, the method further includes: implementing a repairing process to the first sector if the first sector has one byte failing the testing.

Optionally, the testing process is a memory built-in self test.

According to one embodiments, an apparatus for testing a memory is provided, where the memory includes a plurality of sectors each of which includes a plurality of bytes, and the apparatus is adapted to perform a testing to the memory byte by byte, the apparatus comprises a testing module which is configured to: once a first byte in a first sector fails the testing, stop testing the rest bytes in the first sector which haven't been tested, and skip to test a second byte in a second sector.

Optionally, when the first sector fails the testing, a failure flag will be recorded for the first sector, thus within a whole testing flow, the first sector will not be tested again.

Optionally, the second byte in the second sector is an initial byte in the second sector.

Optionally, the second sector is arranged next to the first sector

Optionally, the testing module is further configured to: test an initial byte in a sector arranged next to the first sector, if all bytes in the first sector pass the testing.

Optionally, the apparatus further comprising a repairing module which is configured to: implement a repairing process to the first sector if the first sector has one byte failing the testing.

Optionally, the testing is a memory built-in self test.

Accordingly, when a byte of the first sector has not passed the testing process, the testing will be implemented to a following second sector, and the remained bytes of the first sector will not be tested any more. Furthermore, within a whole testing flow, other testing items also will not be implemented to the first sector. Therefore, redundant testing steps can be avoided and testing efficiency can be improved.

DETAILED DESCRIPTION

In order to clarify the objects, characteristics and advantages of the present disclosure, embodiments of the present disclosure will be described in detail in conjunction with the accompanying drawings. The disclosure will be described with reference to certain embodiments. Accordingly, the present disclosure is not limited to the embodiments disclosed. It will be understood by those skilled in the art that various changes may be made without departing from the spirit or scope of the disclosure.

As recited in the background, when one byte of a sector fails the testing, it can be obtained that the sector where the byte located should be repaired. Then, other bytes of the sector are not necessarily to be tested any more. Furthermore, other testing items within a whole testing flow are also not necessarily to be implemented to the failed sector.

Accordingly, exiting testing processes are redundant, thus testing efficiency are lower. Therefore, a memory testing method which can avoid redundant processes and has higher efficiency is required.

Figure 1:
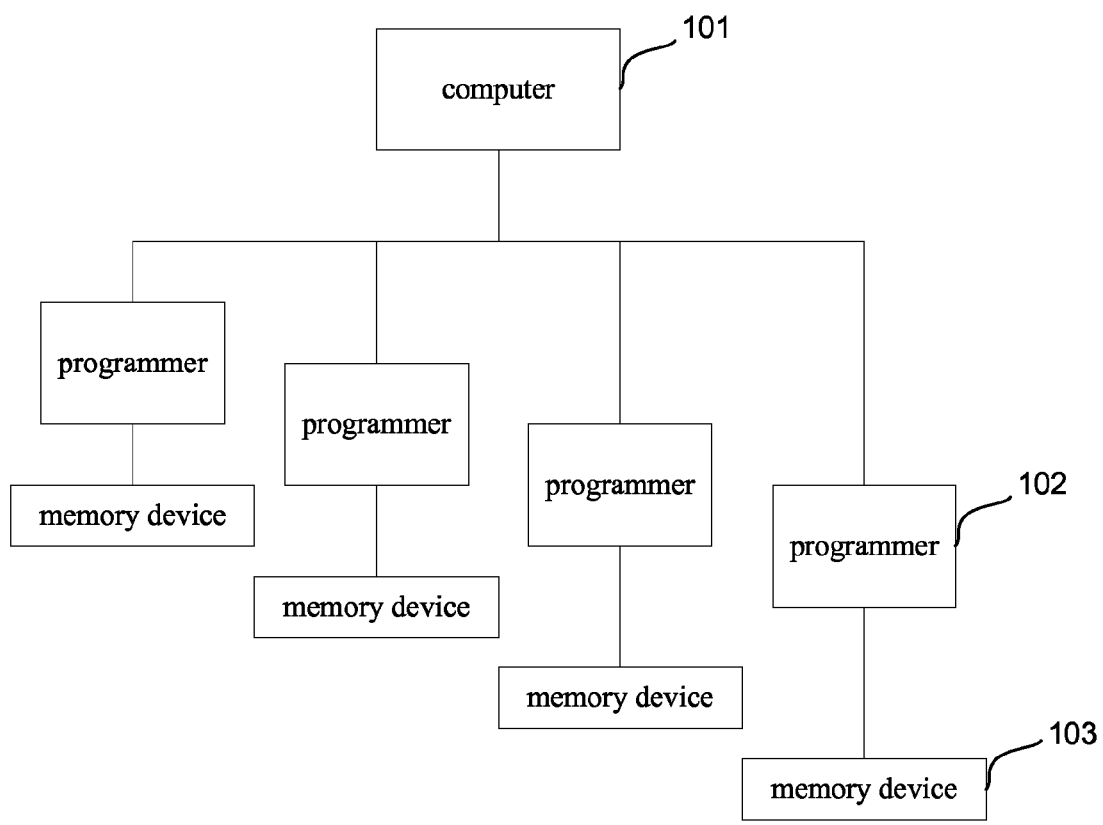
FIG. 1 schematically illustrates a system for testing a memory according to one embodiment of the present disclosure.

Referring to FIG. 1, a system for testing a memory is illustrated. The system includes a computer 101, a plurality of programmers 102 connected with the computer 101, and a plurality of memory devices 103 need to be tested, wherein the plurality of memory devices 103 are connected with the plurality of programmers 102 respectively. When testing the memory devices 103, the computer 101 is used for controlling the programmers 102 to write data into the memory devices 103, erase data from the memory devices 103, or read data out from the memory devices 103, or force some special stress testing condition to screen potential reliability defect, so as to test a writing performance, an erasing performance, a read performance, other special stress testing modes of the memory devices 103. It should be noted that, the computer 101 may only control one of the programmers 102 at one time, or control more than one programmer 102 at the same time. The computer 101 may be controlled by a program, thus the system can testing the memory devices 103 automatically.

Figure 2:
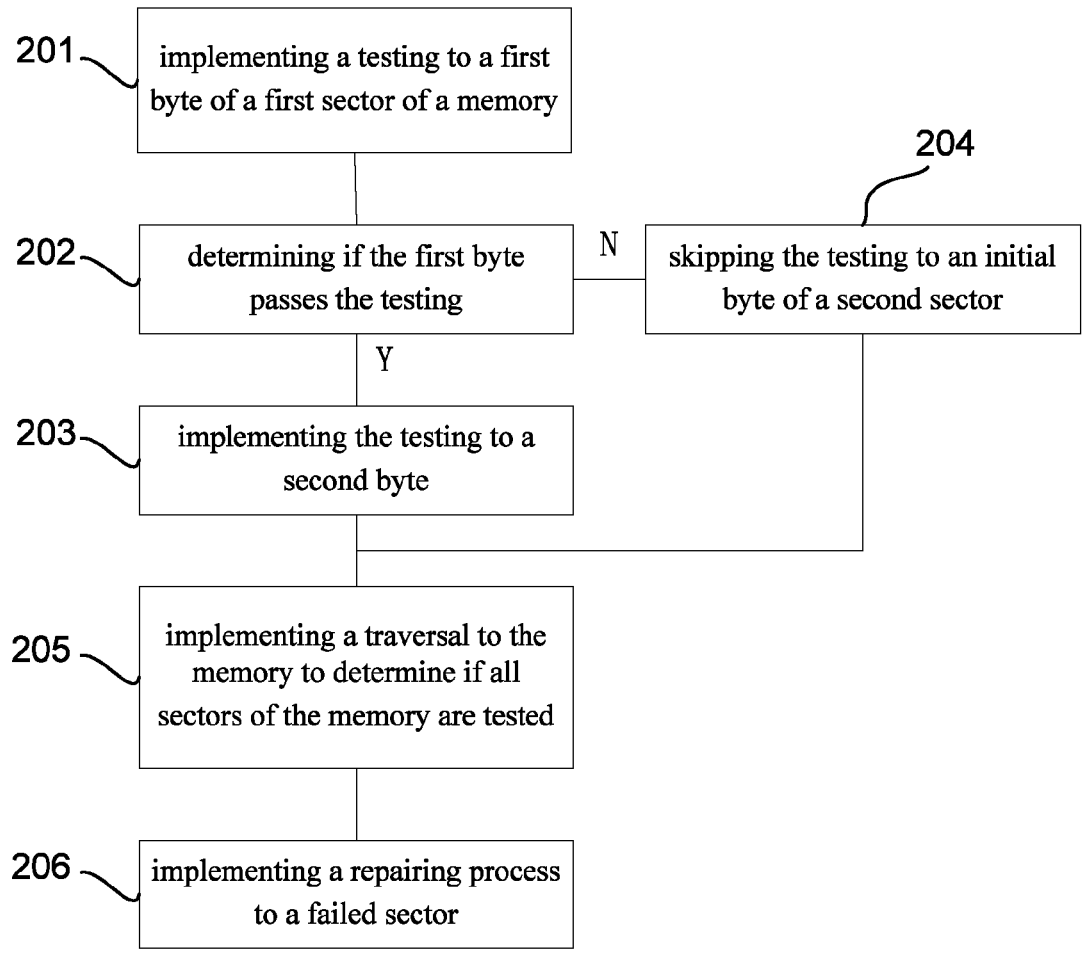
FIG. 2 schematically illustrates a flow chart of a method for testing a memory according to one embodiment of the present disclosure.

Referring to FIG. 2, a method for testing a memory is illustrated. The method includes follow steps.

In step 201, implementing a testing to a first byte of a first sector of a memory.

The memory may include a plurality of sectors each of which may include a plurality of bytes. In some embodiments, the memory may be a flash memory having a storage capacity of 132K. Accordingly, the flash memory may include 246 sectors, and each of the sectors may have 512 bytes.

Testing the first byte of the first sector may be implemented by various ways. In some embodiments, the testing may be implemented by: numbering sectors of the memory; numbering bytes of each of the numbered sectors; and testing the numbered sectors one by one, wherein the numbered sectors are tested byte by byte according to the numbered order. For example, the sectors may be numbered to include a first sector, a second sector, a third sector, and so on. Further, one of the sectors, such as the first sector, may be further numbered to include a first byte, a second byte, a third byte, and so on. In some embodiments, the testing may be implemented by: numbering the bytes of the memory; and testing the bytes in the numbered order. For example, all bytes of the sectors may be numbered to include a first byte, a second byte, a third byte, and so on.

It should be noted that, the numbered orders of each sector and each byte are used for distinguishing one sector from another sector, and distinguishing one byte from another byte, and should not be taken as a limitation to positions of the sectors and the bytes.

Numbering the sectors and numbering the bytes can be implemented by a testing program. The memory may include a register for storing sector addresses of the sectors. The testing program may include a calculation of a testing pointer, wherein the testing pointer is adapted to point one of the sector addresses in the register. Therefore, the testing order can be controlled by controlling the testing pointer.

In step 202, determining if the first byte has passed the testing.

Determining if the first byte passes the testing may be implemented by: determining if the first byte can be implemented to a write operation, erase operation, read operation, and other special stress test modes, and has no data loss.

In some embodiments, testing the first byte may be implemented by a direct test, an embedded CPU (Central Processing Unit), or a MBIST (Memory Built In Self Test).

When the MBIST is used for testing the first byte, determining if the first byte passes the testing can be implemented by: writing first data into the first byte; implementing a bake; reading second data from the first byte; and comparing the first data with the second data, wherein when the first data and the second data are the same, then the first byte is determined as passed the testing, otherwise, the first byte is determined as failed the testing.

In step 203, if the first byte has passed the testing, implementing the testing to a following second byte.

In some embodiments, the first byte may be the last byte of the first sector, and the following second byte is the first byte of a following second sector.

In some embodiments, the testing program may further include a counter for recording the testing. Specifically, after implementing the testing to the first byte, the testing pointer will point the following second byte, and a value of the counter will plus one. Thus, the second byte can be determined by comparing the value of the counter with the number of bytes included in the first sector. For example, if the first sector includes 512 bytes, then the second byte can be determined by comparing the value of the counter with 512. Specifically, when the value of the counter is less than 512, the second byte and the first byte are both in the first sector and the second byte follows the first byte according to the numbering of the bytes; when the value of the counter is larger than 512, the second byte is in the second sector, wherein the second sector follows the first sector according to the numbering of the sectors.

In some embodiments, when the first sector has one or more bytes fails the testing, the method may further includes: recording a failure flag for the first sector, thus within whole testing flow, the first sector will not be tested again In step 204, if the first byte of the first sector fails the testing, skipping the testing to an initial byte of a second sector.

As recited above, when one sector of the memory is taken as the repairing unit, and if one byte of a first sector fails the testing, then it is sufficient enough to determine that the first sector needs to be repaired. Therefore, it is not necessary to implementing the testing to remind bytes of the first sector any more, so as to improve testing efficiency.

In some embodiments, there may be more than one testing item. For example, two testing items are implemented to the memory, so as to respectively test both a writing performance and a reading performance of the memory. If the first sector fails the testing for writing performance, then the testing for reading performance will not implemented to the first sector any more. Accordingly, when a sector fails one of the testing items, this sector will be skipped and not be tested again within the whole testing flow. Therefore, testing efficiency will be further improved.

In some embodiments, when implementing the testing to the following second sector, the testing pointer will point to the first byte of the second sector, and the value of the counter will reset to zero. And one register will record that the first sector fails, thus in other testing items, the first sector test will not be tested any more.

For example, assuming each of the sectors of the memory has 512 bytes, when the $200^{th}$ byte of the $100^{th}$ sector fails the testing, the testing will not implemented to the remained 312 bytes, but the $1^{st}$ byte of the $101^{th}$ sector.

In step 205, implementing a traversal to the memory to determine if all sectors of the memory are tested. When all the sectors of the memory are tested, the testing process will be finished. When any one of the sectors of the memory is not tested, then implementing S201 to S204 to the untested sector.

In step 206, implementing a repairing process to a failed sector.

The failed sector may refer to a sector which includes one or more bytes failing the testing. In other words, if a sector includes one or more bytes failing the testing, then the sector is defined as the failed sector.

It can be understood that, the recited memory does not limited to specific type of memory. Thus, storage medium of the memory may be a semiconductor material, or a magnetic material. In some embodiments, the memory may be a semiconductor flash memory.

It can be seen that, when one byte of a sector is found failing the testing, the reminded bytes of the sector will not be tested any more, and the testing pointer will jump to another sector of the memory. Accordingly, redundant testing can be avoided, and testing efficiency can be improved.

Figure 3:
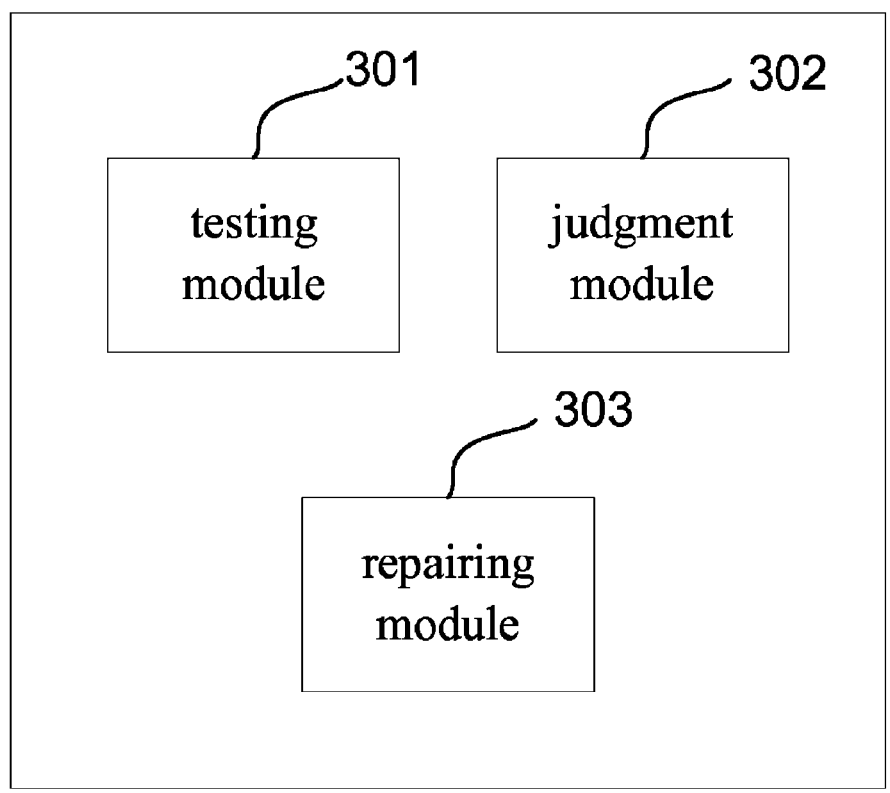
FIG. 3 schematically illustrates a structure of an apparatus for testing a memory according to one embodiment of the present disclosure.

Referring to FIG. 3, an apparatus for testing a memory is illustrated. The apparatus includes a testing module 301, a judgment module 302 and a repairing module 303.

The testing module 301 is configured to implement a test to a first byte of a first sector of the memory.

The judgment module 302 is configured to determine if the first byte of the first sector passes the test and generate a result.

In some embodiments, the judgment module 302 may be further configured to judge whether the failed sector is skipped in other testing item within the whole testing flow.

The testing module 301 is further configured to implement the test to a second byte based on the result generated by the judgment module 302. Specifically, if the result generated indicating that the first byte of the first sector has passed the test, then the second byte is the following byte of the first byte. If the result generated indicating that the first byte of the first sector has failed the test, then the second byte is a first byte of a second sector, wherein the second sector is a following sector of the first sector.

The repairing module 303 is configured to implement a repairing process to a failed sector, wherein the failed sector includes a byte does not pass the test.

It can be seen that, when one byte of a sector is found failing the testing, the reminded bytes of the sector will not be tested any more, and the testing pointer will jump to another sector of the memory. Accordingly, redundant testing can be avoided, and testing efficiency can be improved.

It can be understood that, all steps or some of the steps as recited above can be implemented by a program. The program can be used for controlling corresponding hardware to achieve the steps. The program may be stored in a readable storage medium, such as a ROM (Read Only Memory), a RAM (Random Access Memory), a disk, or a CD (Compact Disc).

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A method for testing a memory, where the memory comprises a plurality of sectors each of which comprises a plurality of bytes, and the testing is performed to the memory byte by byte, comprising: during the testing, once a first byte in a first sector fails the testing, stopping testing the rest bytes in the first sector which haven't been tested, and skipping the testing to a second byte in a second sector.

2. The method according to claim 1, when the first sector fails the testing, further comprising: recording a failure flag for the first sector, thus within a whole testing flow, the first sector will not be tested again.

3. The method according to claim 1, wherein the second byte in the second sector is an initial byte in the second sector.

4. The method according to claim 1, wherein the second sector is arranged next to the first sector.

5. The method according to claim 1, wherein if all bytes in the first sector pass the testing, the testing is performed to an initial byte in a sector arranged next to the first sector.

6. The method according to claim 1, further comprising: implementing a repairing process to the first sector if the first sector has one byte failing the testing.

7. The method according to claim 1, wherein the testing is a memory built-in self test.

8. An apparatus for testing a memory, where the memory comprises a plurality of sectors each of which comprises a plurality of bytes, and the apparatus is adapted to perform a testing to the memory byte by byte, comprising a testing module which is configured to: once a first byte in a first sector fails the testing, stop testing the rest bytes in the first sector which haven't been tested, and skip to test a second byte in a second sector.

9. The apparatus as recited in claim 8, wherein the first sector will be recorded with a failure flag when fails the testing, thus within a whole testing flow, the first sector will not be tested again.

10. The apparatus as recited in claim 8, wherein the second byte in the second sector is an initial byte in the second sector.

11. The apparatus as recited in claim 8, wherein the second sector is arranged next to the first sector.

12. The apparatus according to claim 8, the testing module is further configured to: test an initial byte in a sector arranged next to the first sector, if all bytes in the first sector pass the testing.

13. The apparatus according to claim 8, further comprising a repairing module which is configured to: implement a repairing process to the first sector if the first sector has one byte failing the testing.

14. The apparatus according to claim 8, wherein the testing is a memory built-in self test.

* * * * *